United States Patent
Chang et al.

(10) Patent No.: US 12,376,399 B2
(45) Date of Patent: Jul. 29, 2025

(54) SENSOR PACKAGE STRUCTURE

(71) Applicant: KINGPAK TECHNOLOGY INC., Hsin-Chu County (TW)

(72) Inventors: Chia-Shuai Chang, Hsin-Chu County (TW); Chien-Chen Lee, Hsin-Chu County (TW); Chien-Yuan Wang, Hsin-Chu County (TW); Yi-Chih Lee, Hsin-Chu County (TW); Li-Chun Hung, Hsin-Chu County (TW)

(73) Assignee: TONG HSING ELECTRONIC INDUSTRIES, LTD., Taipei (TW)

( * ) Notice: Subject to any disclaimer, the term of this patent is extended or adjusted under 35 U.S.C. 154(b) by 633 days.

(21) Appl. No.: 17/852,384

(22) Filed: Jun. 29, 2022

(65) Prior Publication Data

US 2023/0197744 A1     Jun. 22, 2023

Related U.S. Application Data

(60) Provisional application No. 63/292,015, filed on Dec. 21, 2021.

(30) Foreign Application Priority Data

Jun. 15, 2022 (TW) .................................. 111122116

(51) Int. Cl.
*H10F 39/00*     (2025.01)
*H01L 23/00*     (2006.01)

(52) U.S. Cl.
CPC ....... *H10F 39/804* (2025.01); *H10F 39/8057* (2025.01); *H01L 24/48* (2013.01); *H01L 2224/48227* (2013.01)

(58) Field of Classification Search
CPC .. H10F 39/804; H10F 39/8057; H10F 39/805; H01L 24/48; H01L 2224/48227
See application file for complete search history.

(56) References Cited

U.S. PATENT DOCUMENTS

2018/0019274 A1*   1/2018   Yang .................. H10H 20/8506
2020/0350357 A1*   11/2020   Hung ...................... H01L 24/26

* cited by examiner

*Primary Examiner* — Patricia D Valenzuela
(74) *Attorney, Agent, or Firm* — Li & Cai Intellectual Property Office

(57) ABSTRACT

A sensor package structure includes a substrate, a sensor chip disposed on the substrate, a light-curing layer disposed on the sensor chip, a light-permeable layer disposed on the light-curing layer, a shielding layer being ring-shaped and disposed on an inner surface of the light-permeable layer, and a package body that is formed on the substrate. A projection region defined by orthogonally projecting the shielding layer onto a top surface of the sensor chip surrounds a sensing region of the sensor chip. A portion of the shielding layer in contact with the light-curing layer defines a ring-shaped arrangement region that has at last one light-permeable slot. The sensor chip, the light-curing layer, the light-permeable layer, and the shielding layer are embedded in the package body that exposes at least part of the light-permeable layer.

20 Claims, 15 Drawing Sheets

SENSOR PACKAGE STRUCTURE

CROSS-REFERENCE TO RELATED PATENT APPLICATION

This application claims the benefit of priority to Taiwan Patent Application No. 111122116, filed on Jun. 15, 2022. The entire content of the above identified application is incorporated herein by reference.

This application claims the benefit of priority to the U.S. Provisional Patent Application Ser. No. 63/292,015 filed on Dec. 21, 2021, which application is incorporated herein by reference in its entirety.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a package structure, and more particularly to a sensor package structure.

BACKGROUND OF THE DISCLOSURE

In a conventional sensor package structure, a glass board is arranged above a sensor chip through a glue layer that surrounds a sensing region of the sensor chip. However, light passing through the glass board may be partially reflected by the glue layer to affect the sensing region of the sensor chip (e.g., to generate a glare phenomenon).

Accordingly, a shielding layer is further provided between the glass board and the glue layer of the conventional sensor package structure for reducing the glare phenomenon. However, the shielding layer embedded in the glue layer is difficult to be entirely solidified and easily has a delamination issue.

SUMMARY OF THE DISCLOSURE

In response to the above-referenced technical inadequacies, the present disclosure provides a sensor package structure to effectively improve on the issues associated with conventional sensor package structures.

In one aspect, the present disclosure provides a sensor package structure, which includes a substrate, a sensor chip, a light-curing layer, a light-permeable layer, a shielding layer, and a package body. The sensor chip is disposed on the substrate along a predetermined direction and is electrically coupled to the substrate. The sensor chip has a sensing region arranged on a top surface thereof. The light-curing layer is ring-shaped. The light-curing layer is disposed on the top surface of the sensor chip and surrounds the sensing region. The light-permeable layer has an outer surface and an inner surface that is opposite to the outer surface. The inner surface of the light-permeable layer is disposed on the light-curing layer, and the light-permeable layer is arranged above the sensor chip. The inner surface of the light-permeable layer, the light-curing layer, and the top surface of the sensor chip jointly define an enclosed space. The shielding layer is ring-shaped and is disposed on the inner surface of the light-permeable layer. Moreover, a projection region defined by orthogonally projecting the shielding layer onto the top surface along the predetermined direction surrounds the sensing region. A portion of the shielding layer in contact with the light-curing layer defines a ring-shaped arrangement region, and the ring-shaped arrangement region has at last one light-permeable slot. The package body is formed on the substrate. The sensor chip, the light-curing layer, the light-permeable layer, and the shielding layer are embedded in the package body. The outer surface of the light-permeable layer is at least partially exposed from the package body.

In another aspect, the present disclosure provides a sensor package structure, which includes a substrate, a sensor chip, a light-curing layer, a light-permeable layer, a shielding layer, and a package body. The sensor chip is disposed on the substrate along a predetermined direction and is electrically coupled to the substrate. The sensor chip has a square shape or a rectangular shape, and the sensor chip has a sensing region arranged on a top surface thereof. The light-curing layer is ring-shaped. The light-curing layer is disposed on the top surface of the sensor chip and surrounds the sensing region. The light-permeable layer has an outer surface and an inner surface that is opposite to the outer surface. The inner surface of the light-permeable layer is disposed on the light-curing layer, and the light-permeable layer is arranged above the sensor chip. The inner surface of the light-permeable layer, the light-curing layer, and the top surface of the sensor chip jointly define an enclosed space. The shielding layer is disposed on the inner surface of the light-permeable layer and includes a plurality of shielding strips spaced apart from each other. Any two of the shielding strips adjacent to each other are spaced apart from each other by a region that corresponds in position to a corner of the sensor chip. Each of the shielding strips has at least one light-permeable slot, and wherein a projection region defined by orthogonally projecting the shielding layer onto the top surface along the predetermined direction surrounds the sensing region. The package body is formed on the substrate. The sensor chip, the light-curing layer, the light-permeable layer, and the shielding layer are embedded in the package body. The outer surface of the light-permeable layer is at least partially exposed from the package body.

Therefore, under the premise that the shielding layer of the sensor package structure provided by the present disclosure is used to block light for reducing the flare phenomenon caused by light reflected from the light-curing layer, the at least one light-permeable slot of the shielding layer allows light to irradiate onto the light-curing layer by passing therethrough, so that light-curing layer can be entirely solidified to prevent the light-permeable layer from tilting, and delamination does not occur between the shielding layer and the light-curing layer, thereby effectively increasing the production yield of the sensor package structure.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
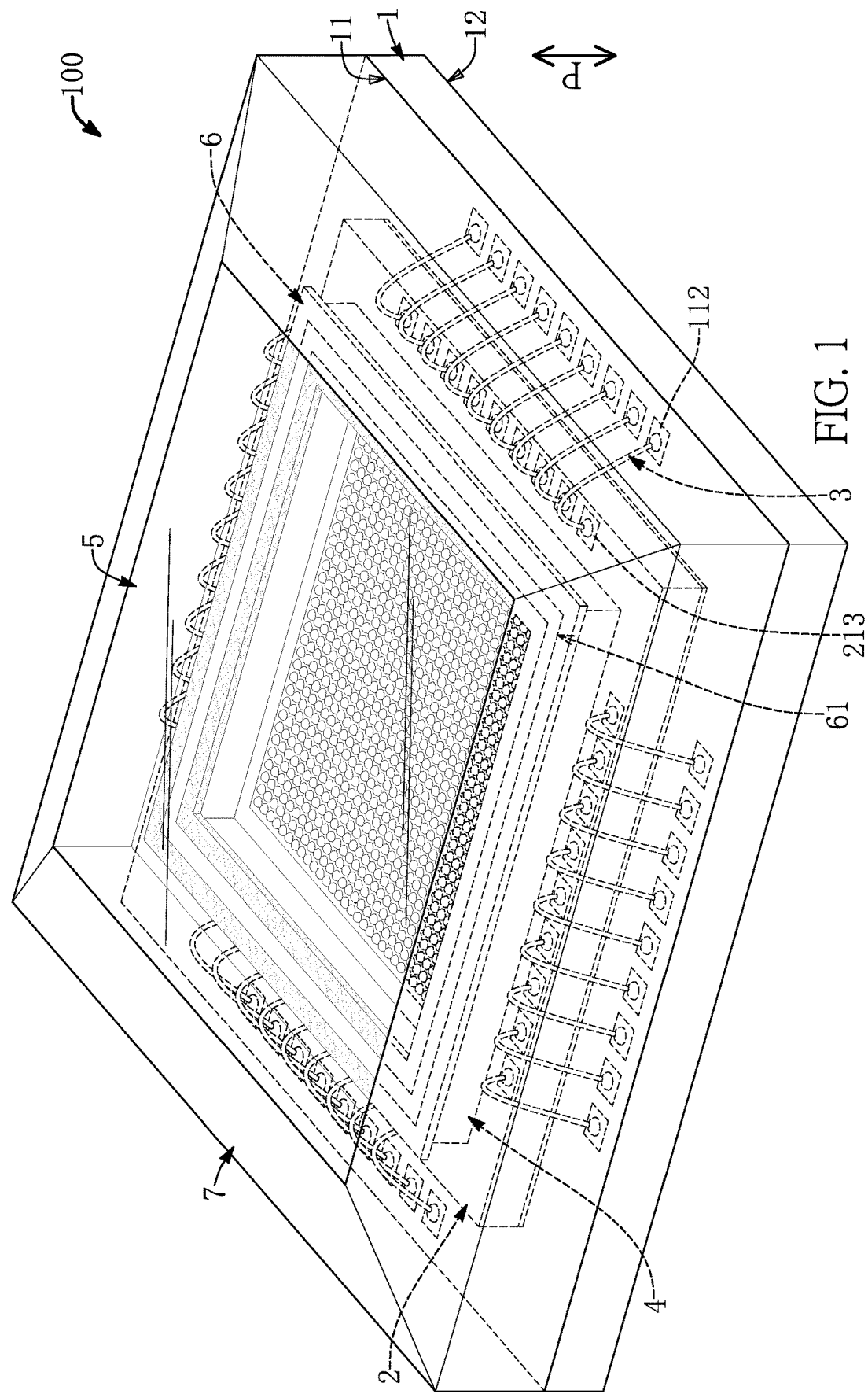
FIG. 1 is a perspective view of a sensor package structure according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
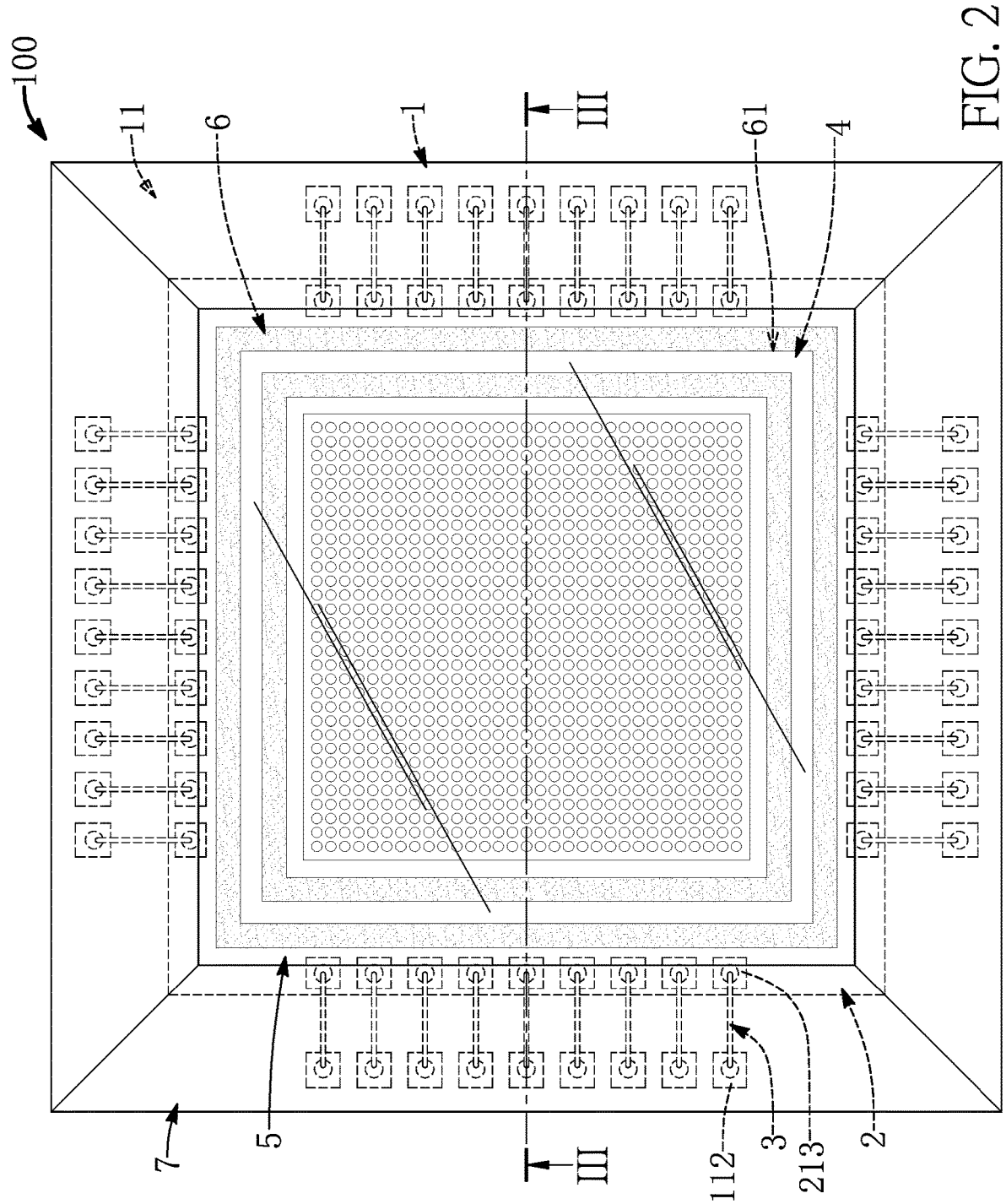
FIG. 2 is a top view of FIG. 1.

Referring to FIG. 1 to FIG. 9, a first embodiment of the present disclosure provides a sensor package structure 100. As shown in FIG. 1 and FIG. 2, the sensor package structure 100 of the present embodiment is different from and is not suitable to be compared to any package structure without encapsulating a sensor chip therein.

Figure 3:
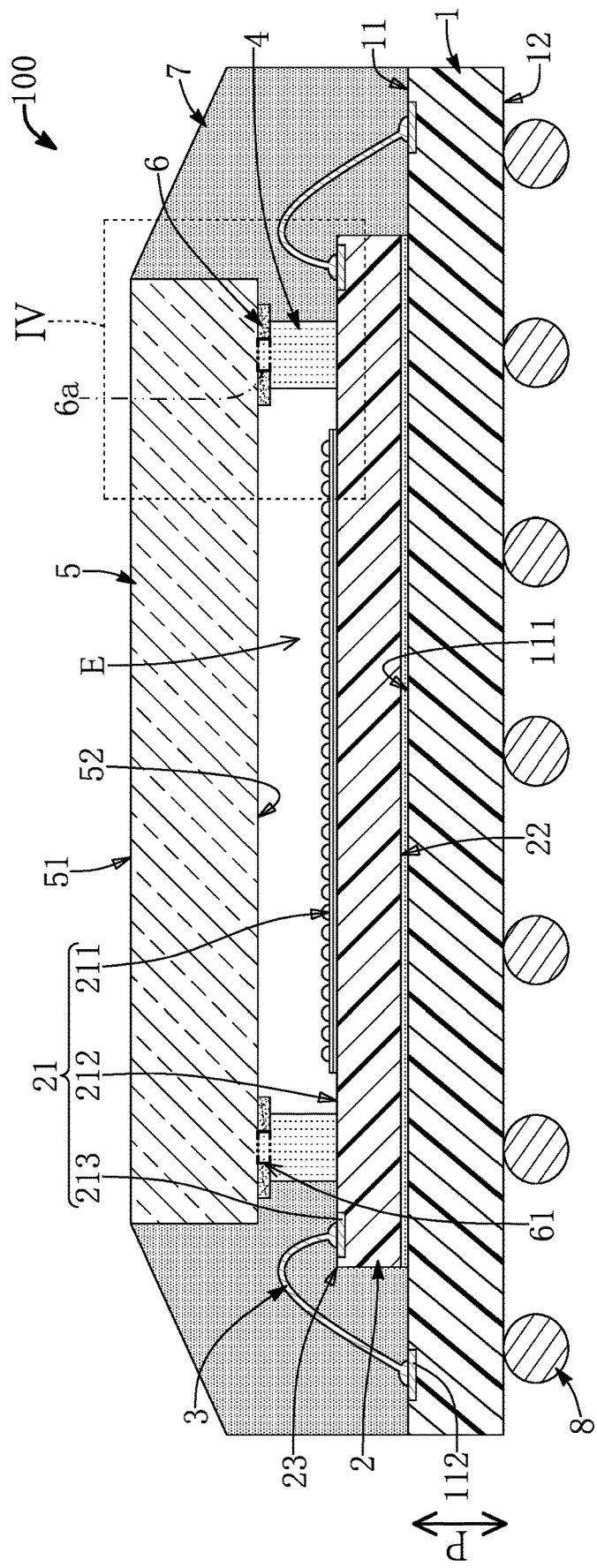
FIG. 3 is a cross-sectional view taken along line III-III of FIG. 2.
Figure 4:
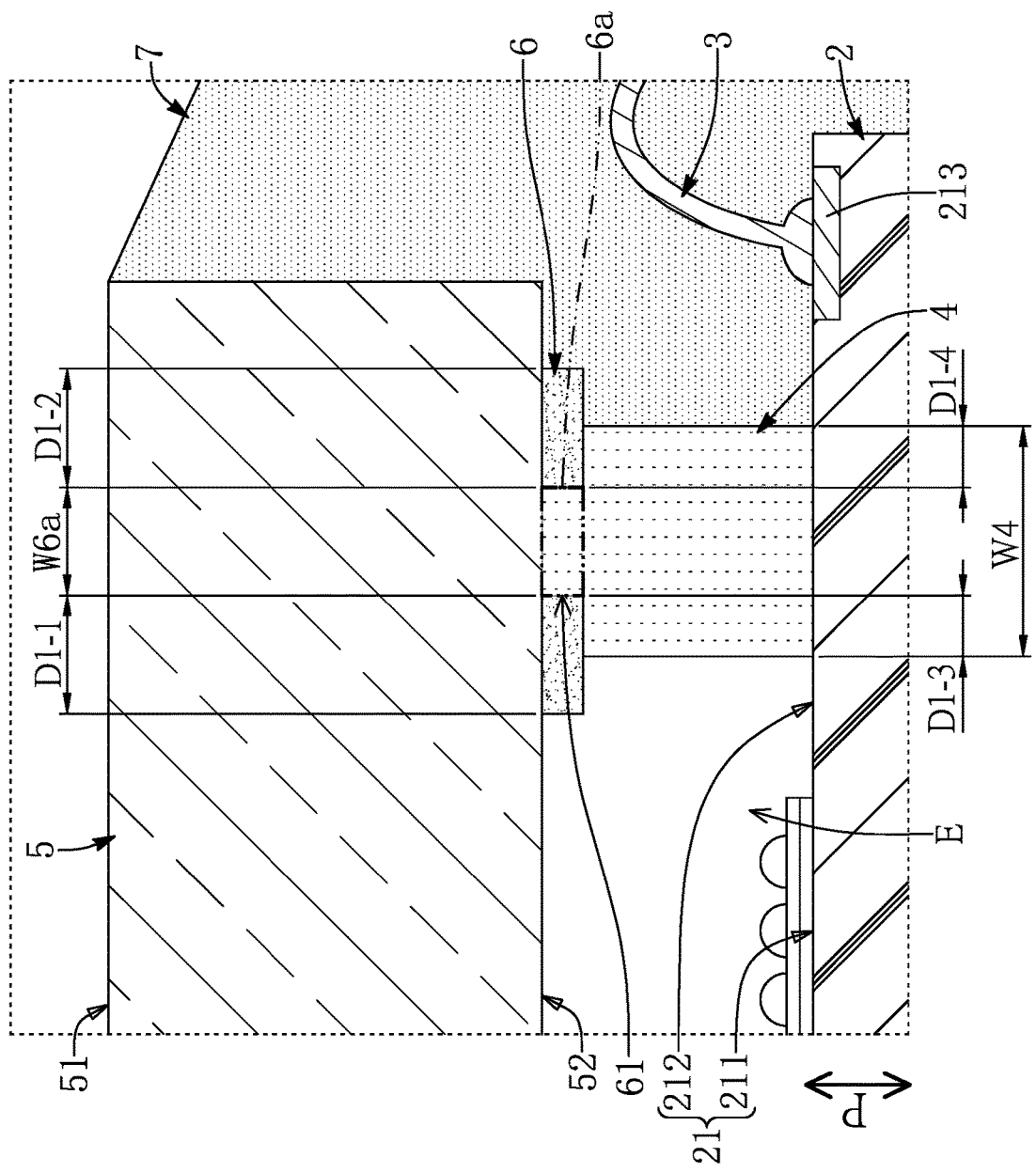
FIG. 4 is an enlarged view of part IV of FIG. 3.
Figure 5:
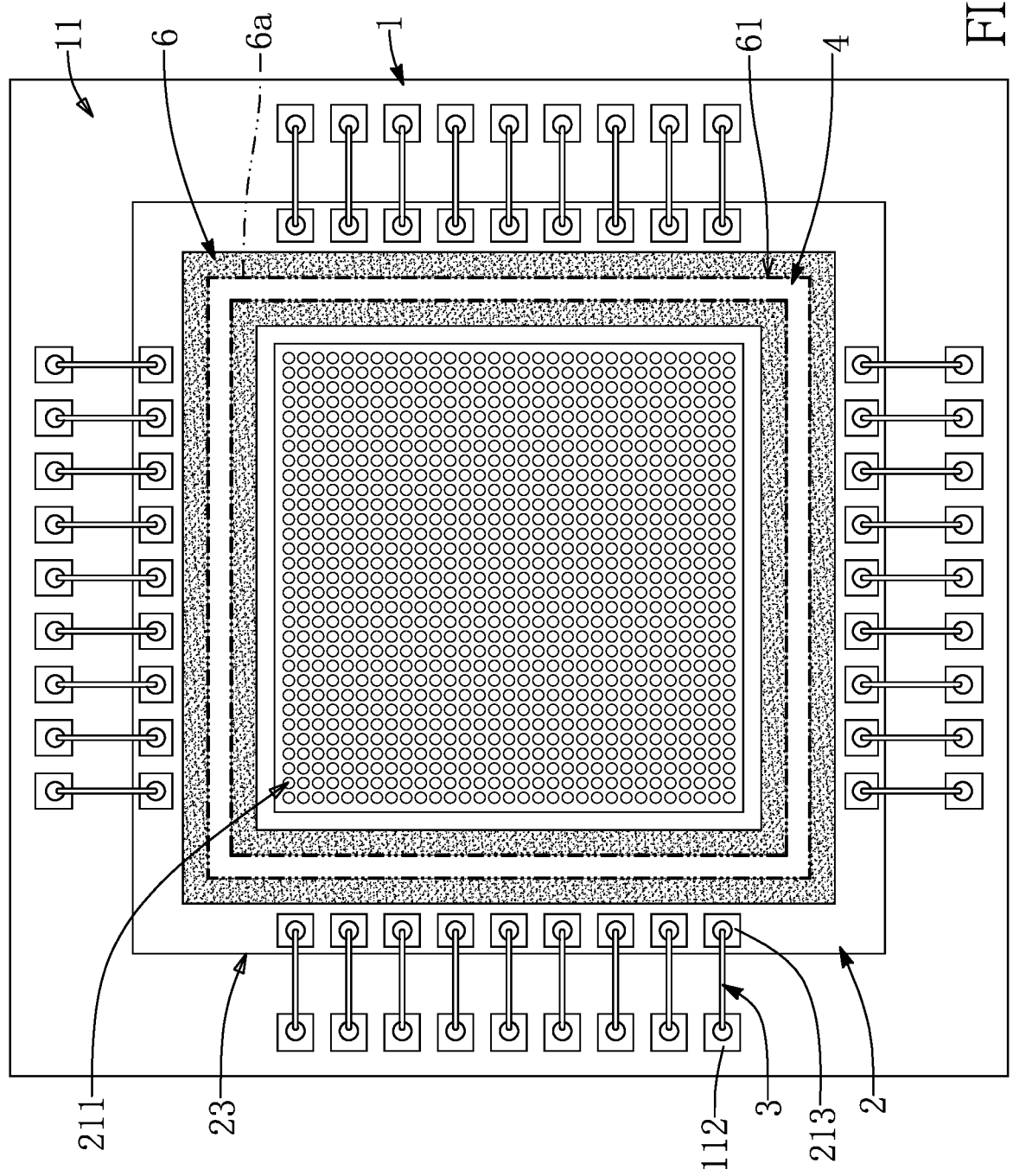
FIG. 5 is a top view of FIG. 1 without depicting a light-permeable layer and a package body.

As shown in FIG. 3 to FIG. 5, the sensor package structure 100 in the present embodiment includes a substrate 1, a sensor chip 2 disposed on the substrate 1, a plurality of metal wires 3 electrically coupled to the substrate 1 and the sensor chip 2, a light-curing layer 4 being ring-shaped and disposed on the sensor chip 2, a light-permeable layer 5 disposed on the light-curing layer 4, a shielding layer 6 disposed on the light-permeable layer 5, and a package body 7 that is formed on the substrate 1.

Although the sensor package structure 100 in the present embodiment is illustrated based on including the above components, but the sensor package structure 100 can be modified according to design requirements. For example, in other embodiments of the present disclosure not shown in the drawings, the sensor package structure 100 can be provided without the metal wires 3, and the sensor chip 2 is fixed onto and electrically coupled to the substrate 1 in a flip-chip manner; or, the package body 7 of the sensor package structure 100 can be omitted or can be replaced by other components. The following description describes the structure and connection relationship of each component of the sensor package structure 100.

The substrate 1 in the present embodiment has a square shape or a rectangular shape, but the present disclosure is not limited thereto. An upper surface 11 of the substrate 1 has a chip bonding region 111 and a plurality of bonding pads 112, the chip bonding region 111 is substantially on a center portion of the upper surface 11, and the bonding pads 112 are arranged on the upper surface 11 and outside of the chip bonding region 111. The bonding pads 112 in the present embodiment are substantially in a ring-shaped arrangement, but the present disclosure is not limited thereto. For example, in other embodiments of the present disclosure not shown in the drawings, the bonding pads 112 can be arranged in two rows that are respectively located at two opposite sides of the chip bonding region 111.

In addition, the substrate 1 in the present embodiment can be provided with a plurality of solder balls 8 disposed on a lower surface 12 thereof, and the sensor package structure 100 can be mounted onto an electronic component (not shown) through the solder balls 8, thereby electrically coupling the sensor package structure 100 to the electronic component.

The sensor chip 2 in the present embodiment has a square shape or a rectangular shape and is illustrated as an image sensor chip, but the present disclosure is not limited thereto. A bottom surface 22 of the sensor chip 2 is fixed onto the chip bonding region 111 of the substrate 1 along a predetermined direction P. In other words, the sensor chip 2 is arranged to be surrounded on the inside of the soldering pads 112. Moreover, a top surface 21 of the sensor chip 2 has a sensing region 211 and a carrying region 212 that has a ring-shape arranged around the sensing region 211. The sensor chip 2 includes a plurality of connection pads 213 arranged on the carrying region 212. In other words, the connection pads 213 are arranged outside of the sensing region 211.

The number and positions of the connection pads 213 of the sensor chip 2 in the present embodiment correspond to those of the bonding pads 112 of the substrate 1. Each of the metal wires 3 has a first end and a second end, the first ends of the metal wires 3 are respectively connected to the bonding pads 112, and the second ends of the metal wires 3 are respectively connected to the connection pads 213 (i.e., two opposite ends of each of the metal wires 3 are respectively connected to one of the bonding pads 112 and the corresponding connection pad 213), so that the substrate 1 and the sensor chip 2 can be electrically coupled to each other through the metal wires 3.

The light-curing layer 4 is ring-shaped, and the light-curing layer 4 is disposed on the top surface 21 of the sensor chip 2 and surrounds the sensor chip 2. The light-curing layer 4 in the present embodiment is arranged inside of the metal wires 3 and is not in contact with any one of the metal wires 3, but the present disclosure is not limited thereto. For example, in other embodiments of the present disclosure not shown in the drawings, a part of at least one of the metal wires 3 can be embedded in the light-curing layer 4. In addition, the light-curing layer 4 in the present embodiment can be an ultraviolet (UV) curing layer that can be cured by being irradiated with ultraviolet light.

The light-permeable layer 5 in the present embodiment is a transparent and flat glass board, but the present disclosure is not limited thereto. The light-permeable layer 5 in the present embodiment has an outer surface 51 and an inner surface 52 that is opposite to the outer surface 51. The inner surface 52 of the light-permeable layer 5 is disposed on the light-curing layer 4, so that the light-permeable layer 5 is located above the sensor chip 2. In other words, the light-curing layer 4 is sandwiched between the light-permeable layer 5 and the substrate 1. Moreover, the inner surface 52 of the light-permeable layer 5, the light-curing layer 4, and the top surface 21 of the sensor chip 2 jointly define an enclosed space E.

The shielding layer 6 is ring-shaped and is disposed on the inner surface 52 of the light-permeable layer 5 so as to block light to pass there-through. Moreover, a projection region defined by orthogonally projecting the shielding layer 6 onto the top surface 21 along the predetermined direction P surrounds the sensing region 211. In other words, an inner edge of the shielding layer 6 has an opening located directly above the sensing region 211.

Specifically, a portion of the shielding layer 6 in contact with the light-curing layer 4 defines a ring-shaped arrangement region 6a, and the ring-shaped arrangement region 6a has at last one light-permeable slot 61. The light-curing layer 4 is connected to the inner surface 52 of the light-permeable layer 5 by being filled in the at last one light-permeable slot 61.

Accordingly, under the premise that the shielding layer 6 of the sensor package structure 100 is used to block light for reducing the flare phenomenon that is caused by light reflected from the light-curing layer 4, the at least one light-permeable slot 61 of the shielding layer 6 allows light to irradiate onto the light-curing layer 4 by passing there-through, so that light-curing layer 4 can be entirely solidified to prevent the light-permeable layer 5 from tilting, and delamination does not occur between the shielding layer 6 and the light-curing layer 4, thereby effectively increasing the production yield of the sensor package structure 100.

It should be noted that in order to enable the at least one light-permeable slot 61 of the ring-shaped arrangement region 6a to facilitate reducing the flare phenomenon and entirely solidifying the light-curing layer 4, the ring-shaped arrangement region 6a preferably has at least one of the following structural features, but the present disclosure is not limited thereto.

Specifically, the ring-shaped arrangement region 6a is spaced apart from the inner edge of the shielding layer 6 by a distance D1-1 within a range from 90 μm to 110 μm, and the ring-shaped arrangement region 6a is spaced apart from an outer edge of the shielding layer 6 by a distance D1-2 within a range from 90 μm to 110 μm. The ring-shaped arrangement region 6a is spaced apart from an inner edge of the light-curing layer 4 by a distance D1-3 within a range from 45 μm to 55 μm, and the ring-shaped arrangement region 6a is spaced apart from an outer edge of the light-curing layer 4 by a distance D1-4 within a range from 45 μm to 55 μm. Moreover, a width W6a of the ring-shaped arrangement region 6a is within a range from 25% to 100% of a distance W4 between the inner edge and the outer edge of the light-curing layer 4.

In the present embodiment, a quantity and shape of the at least one light-permeable slot 61 of the ring-shaped arrangement region 6a can be adjusted or changed according to different design requirements. In order to facilitate reducing the flare phenomenon and entirely solidifying the light-curing layer 4, the following description of the present embodiment describes some possible patterns of the shielding layer 6, but the present disclosure is not limited thereto.

Figure 6:
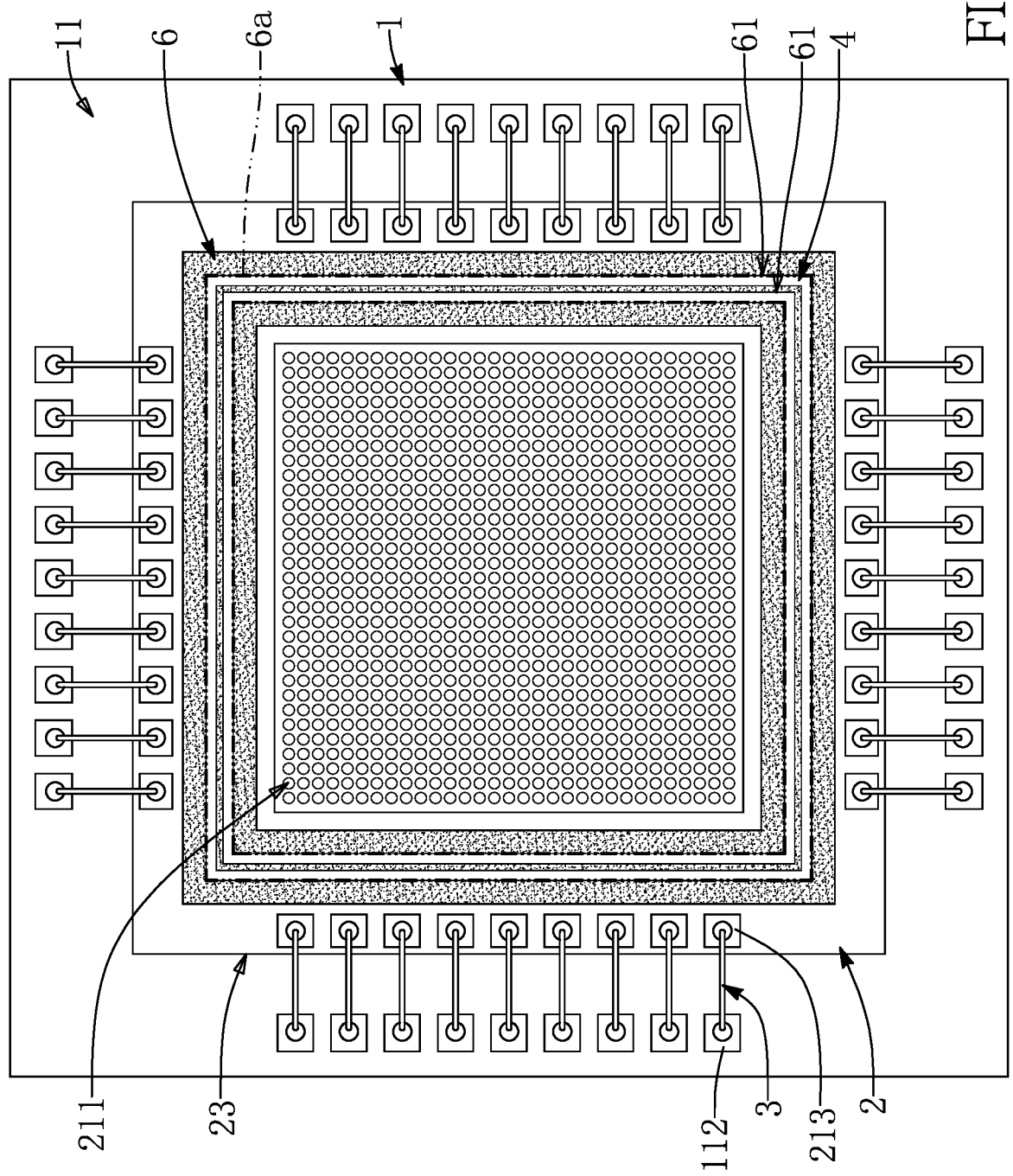
FIG. 6 to FIG. 9 are top views showing variations of a shielding layer of FIG. 5.

As shown in FIG. 5 and FIG. 6, the at least one light-permeable slot 61 is ring-shaped and is arranged to occupy 25% to 100% of the ring-shaped arrangement region 6a. Specifically, as shown in FIG. 5, a quantity of the at least one light-permeable slot 61 is only one, and the light-permeable slot 61 is arranged to occupy 100% of the ring-shaped arrangement region 6a. Or, as shown in FIG. 6, a quantity of the at least one light-permeable slot 6a is more than one (e.g., can be two), and the light-permeable slots 61 are arranged to occupy 25% to 100% of the ring-shaped arrangement region 6a.

Figure 7:
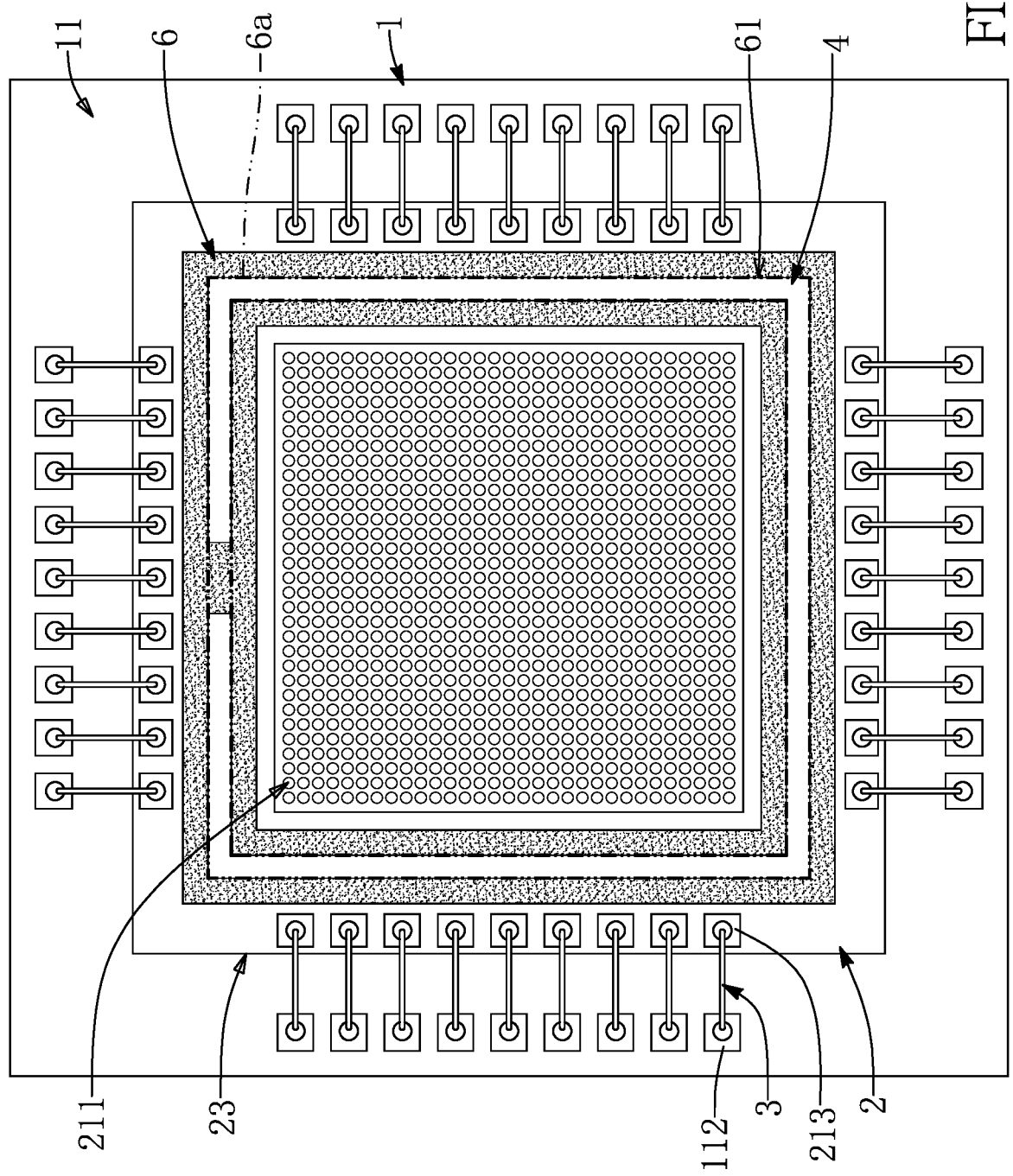

As shown in FIG. 7, the at least one light-permeable slot 61 is C-shaped and is arranged to occupy 25% to 95% of the ring-shaped arrangement region 6a. Moreover, as shown in FIG. 7 of the present embodiment, a quantity of the at least one light-permeable slot 61 is only one, but the present disclosure is not limited thereto. For example, in other embodiments of the present disclosure not shown in the drawings, a quantity of the at least one light-permeable slot 61 being C-shaped can be more than one.

Figure 8:
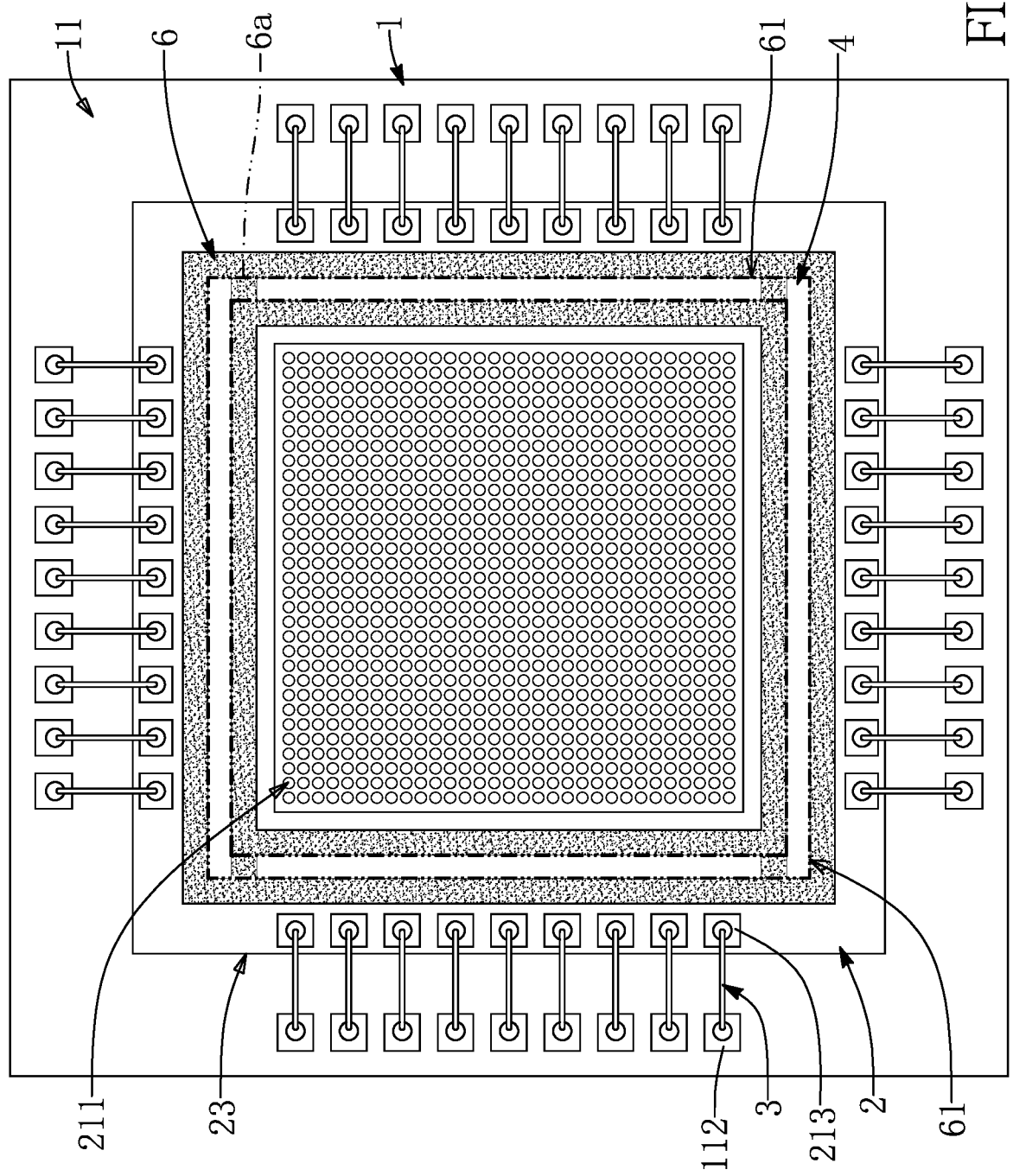
Figure 9:
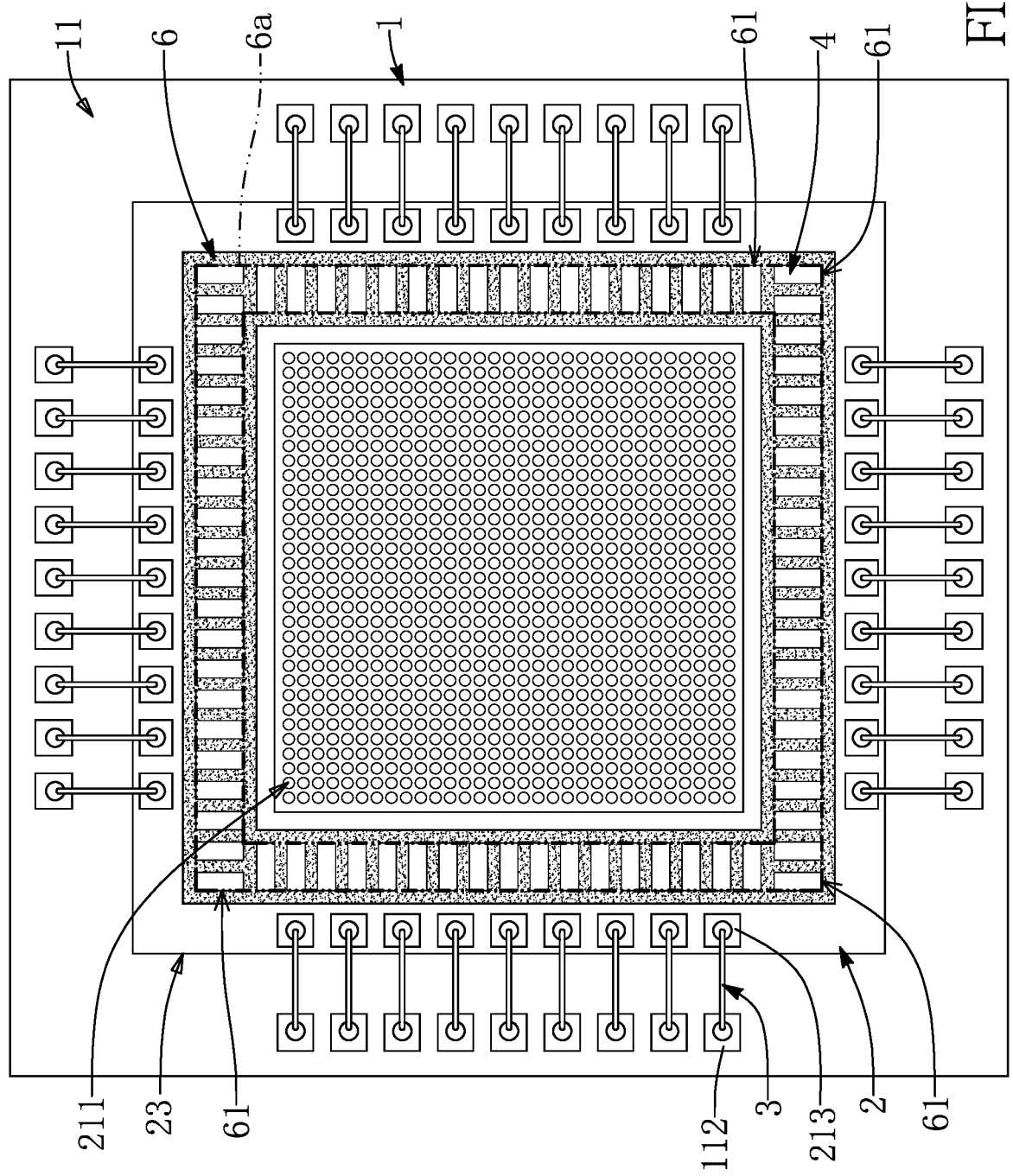

As shown in FIG. 8 and FIG. 9, a quantity of the at least one light-permeable slot 61 is more than one. Each of the light-permeable slots 61 has a strip shape, and the light-permeable slots 61 respectively correspond in position to edges 23 of the sensor chip 2. Specifically, as shown in FIG. 9, each of the edges 23 of the sensor chip 2 corresponds in position to and is perpendicular to at least two of the light-permeable slots 61, and the light-permeable slots 61 are arranged to occupy 25% to 100% of the ring-shaped arrangement region 6a.

Or, as shown in FIG. 8, each of the edges 23 of the sensor chip 2 corresponds in position to and is parallel to one of the light-permeable slots 61, and the light-permeable slots 61 are arranged to occupy 25% to 100% of the ring-shaped arrangement region 6a, but the present disclosure is not limited thereto. For example, in other embodiments of the present disclosure not shown in the drawings, each of the edges 23 of the sensor chip 2 corresponds in position to and is parallel to at least two of the light-permeable slots 61.

The package body 7 in the present embodiment is opaque for blocking a visible light to pass there-through. The package body 7 is a molding compound. The package body 7 is formed on the upper surface 11 of the substrate 1, and a peripheral edge of the package body 7 is flush with a peripheral edge of the substrate 1. The sensor chip 2, the light-curing layer 4, the light-permeable layer 5, and the shielding layer 6 are embedded in the package body 7, at least part of the outer surface 51 of the light-permeable layer 5 is exposed from the package body 7, but the present disclosure is not limited thereto.

Second Embodiment

Referring to FIG. 10 to FIG. 15, a second embodiment of the present disclosure is provided, which is similar to the first embodiment of the present disclosure. For the sake of brevity, descriptions of the same components in the first and second embodiments of the present disclosure (e.g., the substrate 1, the sensor chip 2, the metal wires 3, the light-curing layer 4, the light-permeable layer 5, and the package body 7) will be omitted herein, and the following description only discloses different features between the first and second embodiments.

Figure 10:
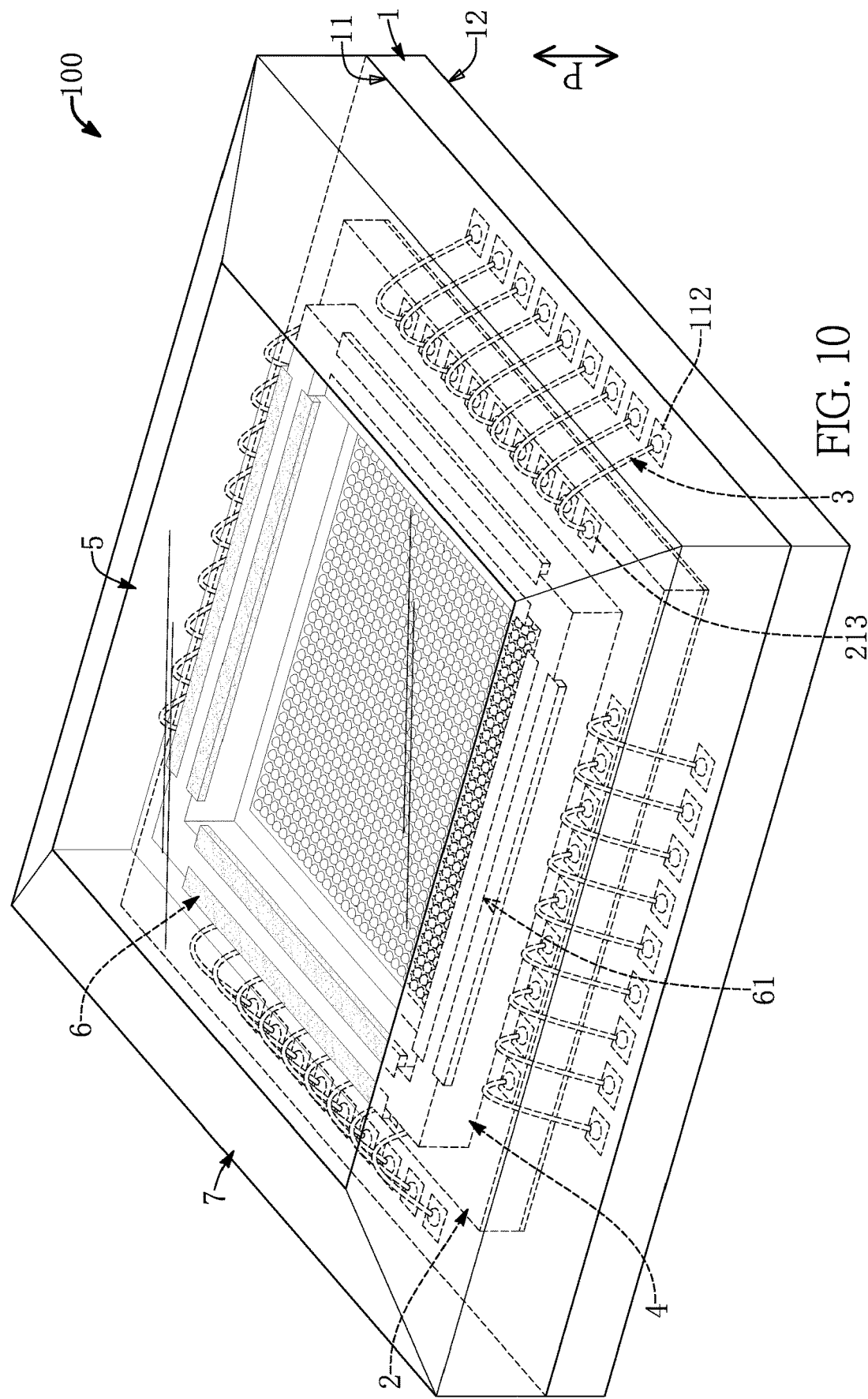
FIG. 10 is a perspective view of the sensor package structure according to a second embodiment of the present disclosure.
Figure 11:
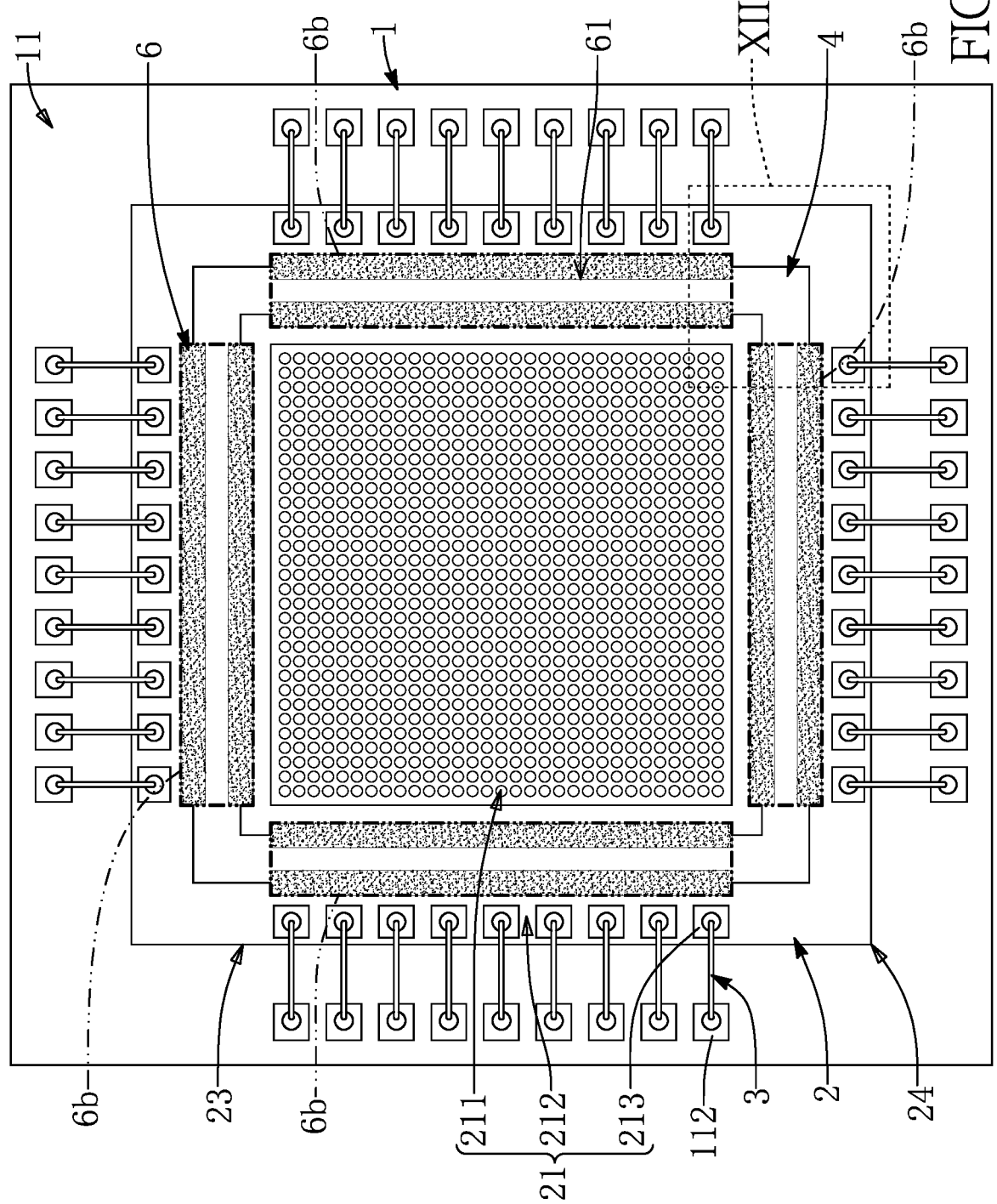
FIG. 11 is a top view of FIG. 10 without depicting the light-permeable layer and the package body.

As shown in FIG. 10 and FIG. 11 of the present embodiment, the shielding layer 6 is formed on the inner surface (not labeled in the drawings) of the light-permeable layer 5, and the shielding layer 6 includes a plurality of shielding strips 6b spaced apart from each other. Moreover, a projection region defined by orthogonally projecting the shielding layer 6 (or the shielding strips 6b) onto the top surface 21 along the predetermined direction P surrounds the sensing region 211. In other words, the sensing region 211 is substantially located inside of the projection region for reducing the flare phenomenon through the shielding layer 6.

Specifically, each of the edges 23 of the sensor chip 2 corresponds in position to and is parallel to one of the shielding strips 6b, and any two of the shielding strips 6b adjacent to each other are spaced apart from each other by a region that corresponds in position to a corner 24 of the sensor chip 2. Accordingly, portions of the light-curing layer 4 respectively arranged above the corners 24 are not covered by the shielding layer 6, thereby facilitating being entirely solidified.

Moreover, each of the shielding strips 6b has at least one light-permeable slot 61, and the light-curing layer 4 can be connected to the inner surface (not labeled in the drawings) of the light-permeable layer 5 by being filled in the at last one light-permeable slot 61. In other words, since the corners 24 of the sensor chip 2 in the present embodiment are not covered by the shielding layer 6, the arrangement of the at least one light-permeable slot 61 of the shielding layer 6 in the present embodiment is different from that of the first embodiment.

In the present embodiment, a quantity and shape of the at least one light-permeable slot 61 of each of the shielding strips 6b can be adjusted or changed according to different design requirements. In order to facilitate reducing the flare phenomenon and entirely solidifying the light-curing layer 4, the following description of the present embodiment describes some possible patterns of the shielding layer 6, but the present disclosure is not limited thereto.

Figure 13:
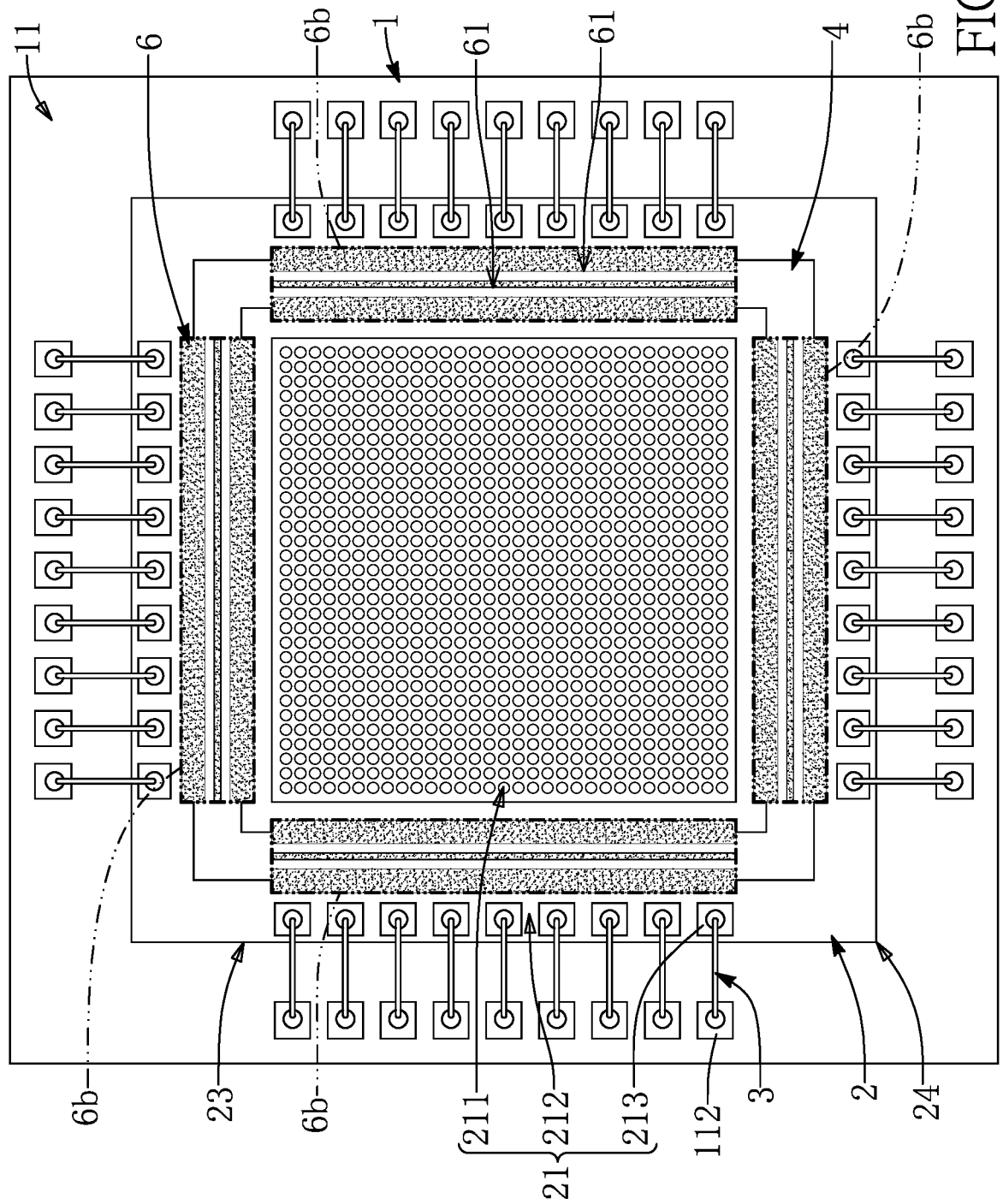
FIG. 13 to FIG. 15 are top views showing variations of the shielding layer of FIG. 10.

As shown in FIG. 11 and FIG. 13, each of the shielding strips 6b provides at least 25% area to form the at least one light-permeable slot 61 that has a strip shape and that penetrates along a longitudinal direction thereof. Moreover, a quantity of the at least one light-permeable slot 61 of each of the shielding strips 6b can be only one (as shown in FIG. 11), or can be at least two (as shown in FIG. 13). The light-permeable slots 61 of each of the shielding strips 6b shown in FIG. 13 are parallel to each other.

Figure 12:
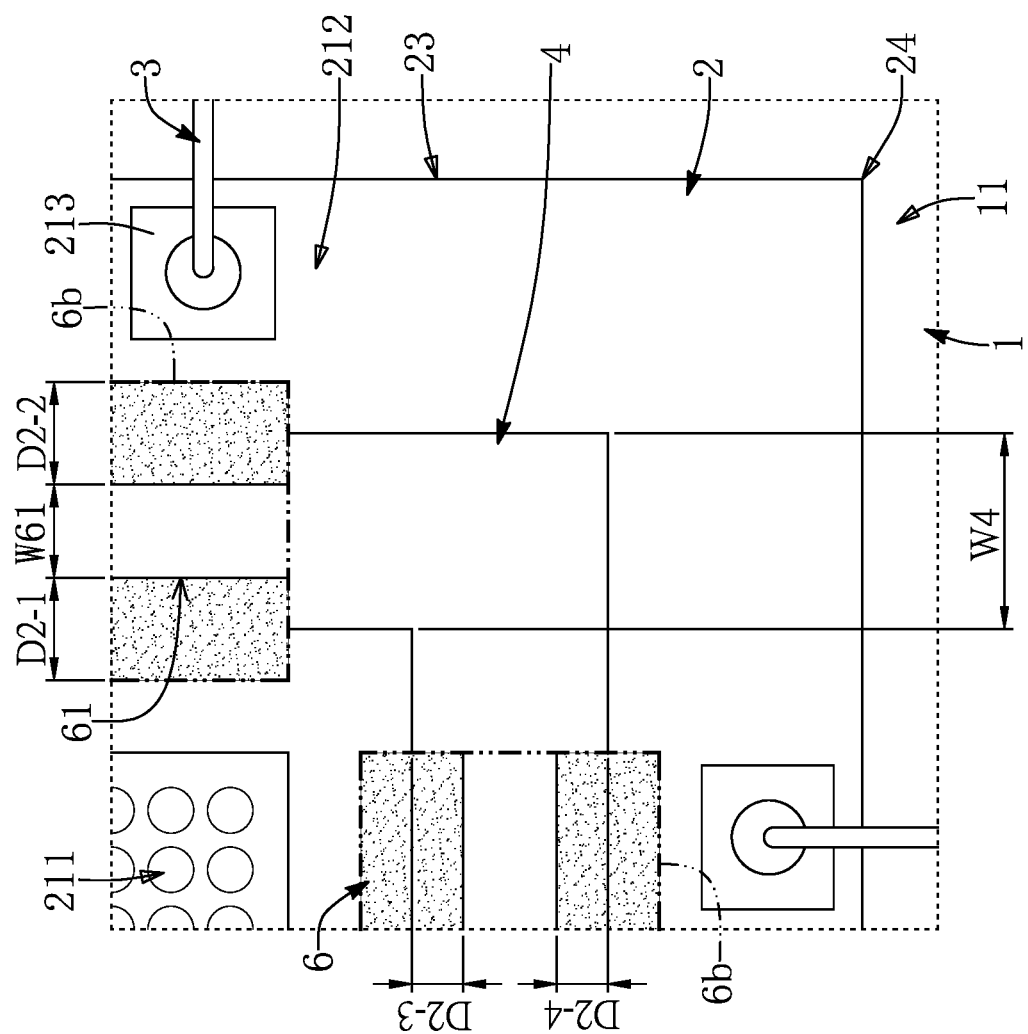
FIG. 12 is an enlarged view of part XI of FIG. 11.

Specifically, in each of the shielding strips 6b as shown in FIG. 11 and FIG. 12, the at least one light-permeable slot 61 is spaced apart from an inner edge of the corresponding shielding strips 6b by a distance D2-1 within a range from 90 μm to 110 μm, the at least one light-permeable slot 61 is spaced apart from an outer edge of the corresponding shielding strips 6b by a distance D2-2 within a range from 90 μm to 110 μm, the at least one light-permeable slot 61 is spaced apart from an inner edge of the light-curing layer 4 by a distance D2-3 within a range from 45 μm to 55 μm, and the at least one light-permeable slot 61 is spaced apart from an outer edge of the light-curing layer 4 by a distance D2-4 within a range from 45 μm to 55 μm. Furthermore, in each of the shielding strips 6b as shown in FIG. 11 and FIG. 12, a width W61 of the at least one light-permeable slot 61 is within a range from 25% to 100% of a distance W4 between the inner edge and the outer edge of the light-curing layer 4.

Figure 14:
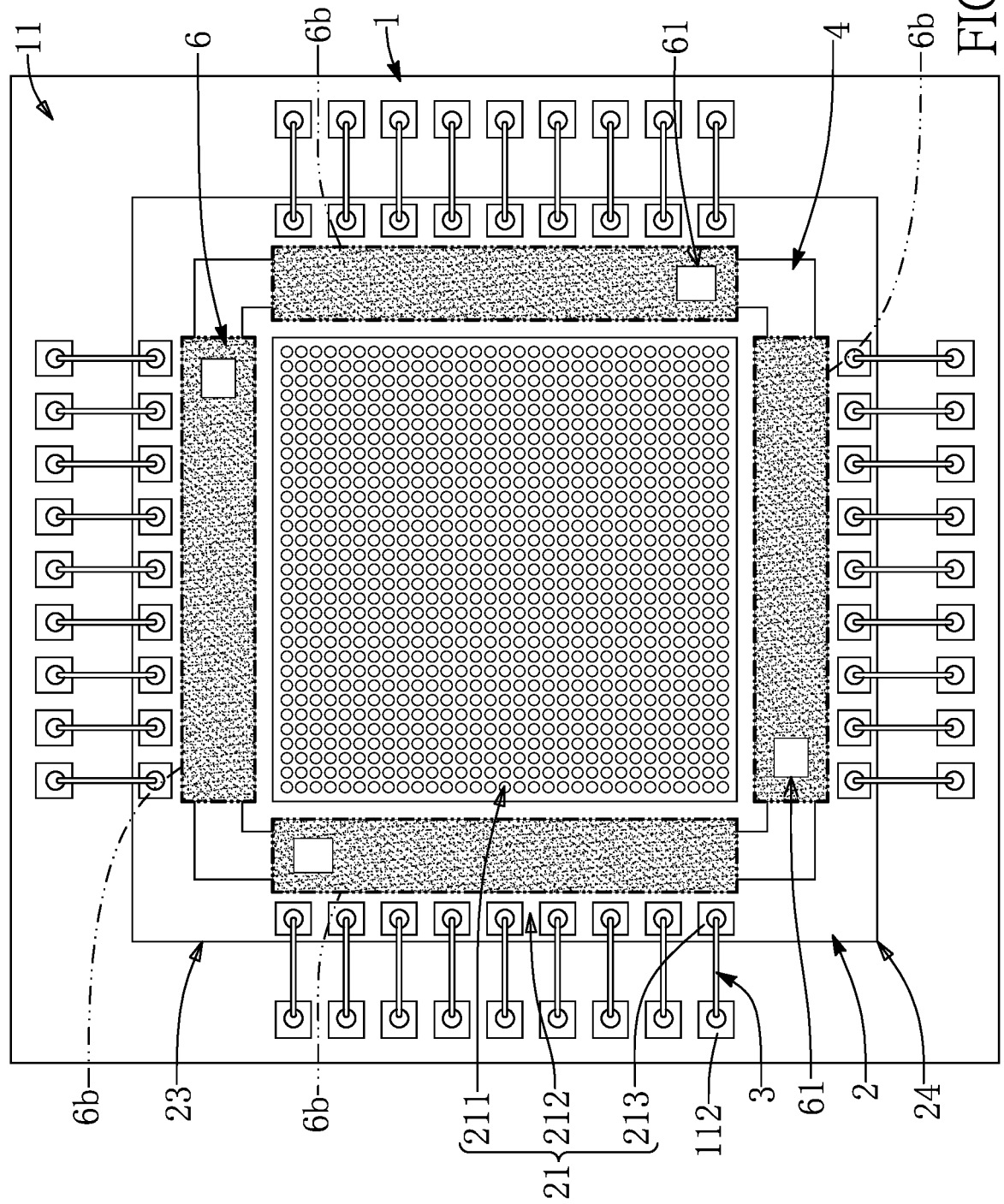

In addition, as shown in FIG. 14, the at least one light-permeable slot 61 can be arranged adjacent to an end of a corresponding one of the shielding strips 6b (i.e., can be arranged adjacent to one of the corners 24 of the sensor chip 2). It should be noted that a quantity and size of the at least one light-permeable slot 61 of any one of the shielding strips 6b can be adjusted or changed according to design requirements and are not limited by the drawings of the present embodiment.

Figure 15:
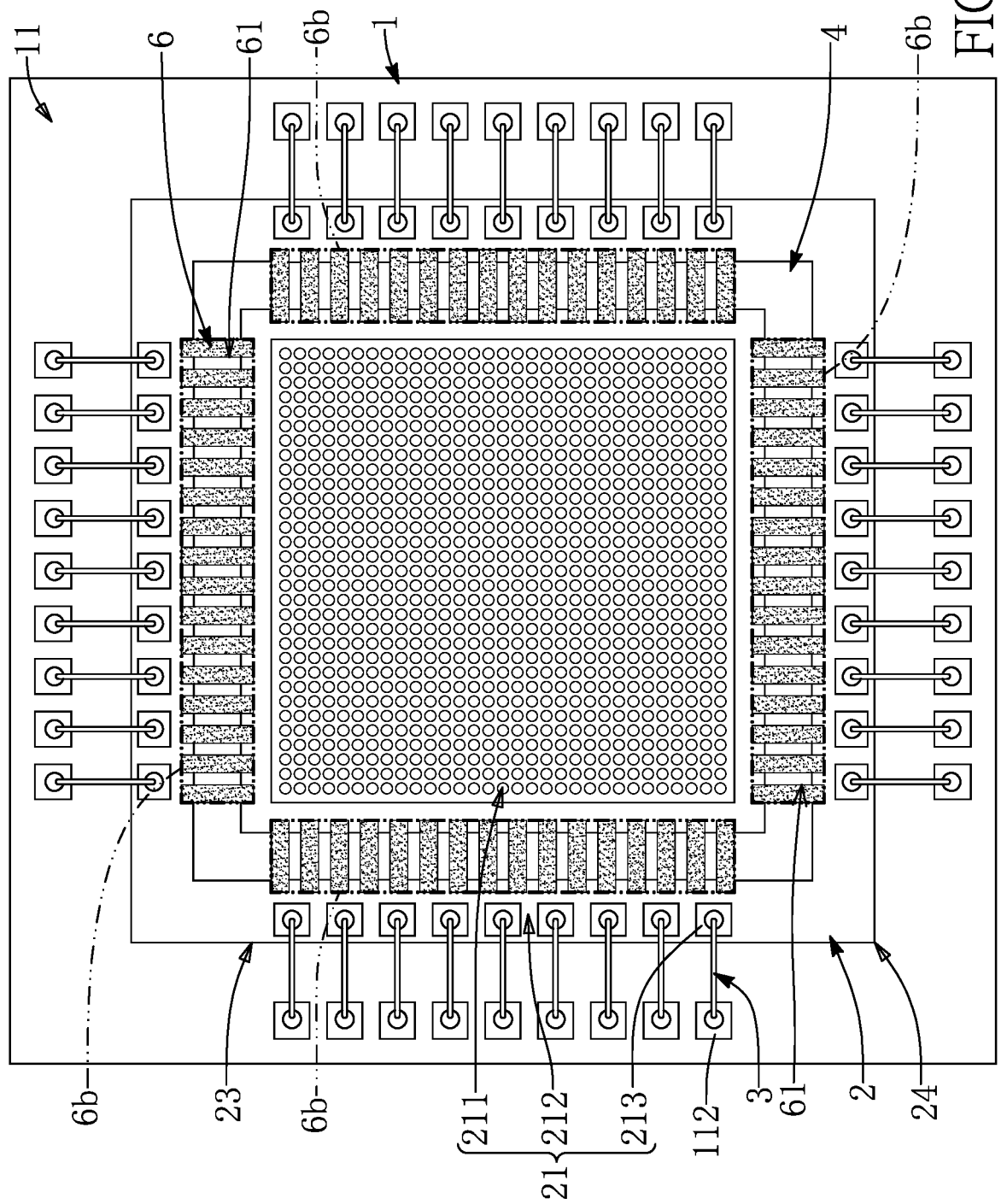

As shown in FIG. 15, each of the shielding strips 6b provides at least 25% area to form the at least one light-permeable slot 61. As shown in FIG. 15, a quantity of the at least one light-permeable slot 61 of each of the shielding strips 6b can be more than one, and each of the light-permeable slots 61 has a strip shape. Furthermore, each of the light-permeable slots 61 penetrates along a width direction of a corresponding one of the shielding strips 6b, and each of the edges 23 of the sensor chip 2 corresponds in position to and is perpendicular to at least two of the light-permeable slots 61.

Beneficial Effects of the Embodiments

In conclusion, under the premise that the shielding layer of the sensor package structure is used to block light for reducing the flare phenomenon that is caused by light reflected from the light-curing layer, the at least one light-permeable slot of the shielding layer allows light to irradiate onto the light-curing layer by passing therethrough, so that light-curing layer can be entirely solidified to prevent the light-permeable layer from tilting, and delamination does not occur between the shielding layer and the light-curing layer, thereby effectively increasing the production yield of the sensor package structure.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A sensor package structure, comprising:
    a substrate;
    a sensor chip disposed on the substrate along a predetermined direction and electrically coupled to the substrate, wherein the sensor chip has a sensing region arranged on a top surface thereof;
    a light-curing layer being ring-shaped, wherein the light-curing layer is disposed on the top surface of the sensor chip and surrounds the sensing region;
    a light-permeable layer having an outer surface and an inner surface that is opposite to the outer surface, wherein the inner surface of the light-permeable layer is disposed on the light-curing layer, and the light-permeable layer is arranged above the sensor chip, and wherein the inner surface of the light-permeable layer, the light-curing layer, and the top surface of the sensor chip jointly define an enclosed space;

a shielding layer being ring-shaped and disposed on the inner surface of the light-permeable layer, wherein a projection region defined by orthogonally projecting the shielding layer onto the top surface along the predetermined direction surrounds the sensing region, and wherein a portion of the shielding layer in contact with the light-curing layer defines a ring-shaped arrangement region, and the ring-shaped arrangement region of the shielding layer has at last one light-permeable slot; and a package body formed on the substrate, wherein the sensor chip, the light-curing layer, the light-permeable layer, and the shielding layer are embedded in the package body, and wherein the outer surface of the light-permeable layer is at least partially exposed from the package body.

2. The sensor package structure according to claim 1, wherein the ring-shaped arrangement region is spaced apart from an inner edge of the shielding layer by a distance within a range from 90 μm to 110 μm, and the ring-shaped arrangement region is spaced apart from an outer edge of the shielding layer by a distance within a range from 90 μm to 110 μm.

3. The sensor package structure according to claim 1, wherein the ring-shaped arrangement region is spaced apart from an inner edge of the light-curing layer by a distance within a range from 45 μm to 55 μm, and the ring-shaped arrangement region is spaced apart from an outer edge of the light-curing layer by a distance within a range from 45 μm to 55 μm.

4. The sensor package structure according to claim 1, wherein a width of the ring-shaped arrangement region is within a range from 25% to 100% of a distance between an inner edge and an outer edge of the light-curing layer.

5. The sensor package structure according to claim 1, wherein the at least one light-permeable slot is ring-shaped and is arranged to occupy 25% to 100% of the ring-shaped arrangement region.

6. The sensor package structure according to claim 5, wherein a quantity of the at least one light-permeable slot is only one, and the light-permeable slot is arranged to occupy 100% of the ring-shaped arrangement region.

7. The sensor package structure according to claim 5, wherein a quantity of the at least one light-permeable slot is more than one, and the light-permeable slots are arranged to occupy 25% to 100% of the ring-shaped arrangement region.

8. The sensor package structure according to claim 1, wherein the at least one light-permeable slot is C-shaped and is arranged to occupy 25% to 95% of the ring-shaped arrangement region.

9. The sensor package structure according to claim 1, wherein the sensor chip has a square shape or a rectangular shape, and a quantity of the at least one light-permeable slot is more than one, and wherein each of the light-permeable slots has a strip shape, and the light-permeable slots respectively correspond in position to edges of the sensor chip.

10. The sensor package structure according to claim 9, wherein each of the edges of the sensor chip corresponds in position to and is parallel to one of the light-permeable slots, and the light-permeable slots are arranged to occupy 25% to 100% of the ring-shaped arrangement region.

11. The sensor package structure according to claim 9, wherein each of the edges of the sensor chip corresponds in position to and is perpendicular to at least two of the light-permeable slots, and the light-permeable slots are arranged to occupy 25% to 100% of the ring-shaped arrangement region.

12. A sensor package structure, comprising:

a substrate;

a sensor chip disposed on the substrate along a predetermined direction and electrically coupled to the substrate, wherein the sensor chip has a square shape or a rectangular shape, and the sensor chip has a sensing region arranged on a top surface thereof;

a light-curing layer being ring-shaped, wherein the light-curing layer is disposed on the top surface of the sensor chip and surrounds the sensing region;

a light-permeable layer having an outer surface and an inner surface that is opposite to the outer surface, wherein the inner surface of the light-permeable layer is disposed on the light-curing layer, and the light-permeable layer is arranged above the sensor chip, and wherein the inner surface of the light-permeable layer, the light-curing layer, and the top surface of the sensor chip jointly define an enclosed space;

a shielding layer disposed on the inner surface of the light-permeable layer and including a plurality of shielding strips spaced apart from each other, wherein any two of the shielding strips adjacent to each other are spaced apart from each other by a region that corresponds in position to a corner of the sensor chip, and each of the shielding strips has at least one light-permeable slot, and wherein a projection region defined by orthogonally projecting the shielding layer onto the top surface along the predetermined direction surrounds the sensing region; and a package body formed on the substrate, wherein the sensor chip, the light-curing layer, the light-permeable layer, and the shielding layer are embedded in the package body, and wherein the outer surface of the light-permeable layer is at least partially exposed from the package body.

13. The sensor package structure according to claim 12, wherein each of edges of the sensor chip corresponds in position to and is parallel to one of the shielding strips, and at least 25% of each of the shielding strips forms the at least one light-permeable slot.

14. The sensor package structure according to claim 12, wherein, in each of the shielding strips, the at least one light-permeable slot is spaced apart from an inner edge of the light-curing layer by a distance within a range from 45 μm to 55 μm, and the at least one light-permeable slot is spaced apart from an outer edge of the light-curing layer by a distance within a range from 45 μm to 55 μm.

15. The sensor package structure according to claim 12, wherein, in each of the shielding strips, a width of the at least one light-permeable slot is within a range from 25% to 100% of a distance between an inner edge and an outer edge of the light-curing layer.

16. The sensor package structure according to claim 12, wherein the at least one light-permeable slot has a strip shape and penetrates along a longitudinal direction of a corresponding one of the shielding strips.

17. The sensor package structure according to claim 16, wherein, in each of the shielding strips, a quantity of the at least one light-permeable slot is more than one, and the light-permeable slots are parallel to each other.

18. The sensor package structure according to claim 12, wherein, the at least one light-permeable slot is arranged adjacent to an end of a corresponding one of the shielding strips.

19. The sensor package structure according to claim 12, wherein, in each of the shielding strips, a quantity of the at least one light-permeable slot is more than one, and wherein each of the light-permeable slots has a strip shape and penetrates along a width direction of a corresponding one of the shielding strips.

20. The sensor package structure according to claim 19, wherein each of the edges of the sensor chip corresponds in position to and is perpendicular to at least two of the light-permeable slots.

* * * * *